(12) United States Patent
Yao et al.

(10) Patent No.: US 10,081,860 B2
(45) Date of Patent: Sep. 25, 2018

(54) VACUUM DEPOSITION APPARATUS AND VAPOR DEPOSITION METHOD

(71) Applicants: BOE TECHNOLOGY GROUP CO., LTD., Beijing (CN); HEFEI XINSHENG OPTOELECTRONICS TECHNOLOGY CO., LTD, Hefei, Anhui (CN)

(72) Inventors: Gu Yao, Beijing (CN); Suwei Zeng, Beijing (CN); Peng Xu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 15 days.

(21) Appl. No.: 15/511,577

(22) PCT Filed: Mar. 25, 2016

(86) PCT No.: PCT/CN2016/077331
§ 371 (c)(1),
(2) Date: Mar. 15, 2017

(87) PCT Pub. No.: WO2017/000596
PCT Pub. Date: Jan. 5, 2017

(65) Prior Publication Data
US 2017/0283938 A1 Oct. 5, 2017
US 2018/0135163 A9 May 17, 2018

(30) Foreign Application Priority Data

Jun. 30, 2015 (CN) .......................... 2015 1 0388186

(51) Int. Cl.
*C23C 14/24* (2006.01)
*C23C 14/54* (2006.01)

(52) U.S. Cl.
CPC ............ *C23C 14/243* (2013.01); *C23C 14/24* (2013.01); *C23C 14/544* (2013.01)

(58) Field of Classification Search
CPC ...... C23C 14/243; C23C 14/544; C23C 14/24
(Continued)

(56) References Cited

U.S. PATENT DOCUMENTS 2,411,715 A * 11/1946 Dimmick .............. C23C 14/044
118/720
2,435,997 A * 2/1948 Bennett ................... C23C 14/24
118/727

(Continued)

FOREIGN PATENT DOCUMENTS

CN 2475739 Y 2/2002
CN 101245442 A 8/2008
(Continued)

OTHER PUBLICATIONS

China Office Action, Application No. 201510388186.7, dated Jan. 25, 2017, 12 pps.: with English Translation.
(Continued)

*Primary Examiner* — Aiden Lee
(74) *Attorney, Agent, or Firm* — Armstrong Teasdale LLP

(57) ABSTRACT

The present disclosure relates to the field of display technology, particularly to a vacuum deposition apparatus and a vapor deposition method. The vacuum deposition apparatus includes a vacuum chamber and a rotary base, an evaporation source, and a plurality of vapor deposition zones arranged in series from bottom to top in the vacuum chamber, wherein the shape of the rotary base is a Reuleaux triangle, and the trajectories of movement of its vertices in the horizontal plane is a rounded square, the vapor deposition zones are arranged at intervals along the trajectories of movement of the vertices of the rotary base, the evaporation source is driven by the rotary base to pass below the vapor deposition zones sequentially, so that the evaporation source can be used to perform the vapor deposition operation in multiple directions simultaneously, thus improving the uniformity of film formation and utilization of the evaporation material.

18 Claims, 3 Drawing Sheets

(58) Field of Classification Search
USPC .................................................. 118/726, 727
See application file for complete search history.

(56) References Cited

U.S. PATENT DOCUMENTS

| | | | | |
|---|---|---|---|---|
| 4,632,059 | A | * 12/1986 | Flatscher | ............... C23C 14/243 |
| | | | | 118/727 |
| 2009/0104721 | A1 | * 4/2009 | Hirakata | ............... C23C 14/042 |
| | | | | 438/29 |
| 2009/0320757 | A1 | * 12/2009 | Wang | .................... C23C 14/243 |
| | | | | 118/727 |

FOREIGN PATENT DOCUMENTS

| | | |
|---|---|---|
| CN | 101294271 A | 10/2008 |
| CN | 103938161 A | 7/2014 |
| CN | 104451554 A | 3/2015 |
| CN | 104911548 A | 9/2015 |
| TW | 200827980 A | 7/2008 |

OTHER PUBLICATIONS

PCT (CN) Written Opinion, Application No. PCT/CN2016/077331, dated Jun. 30, 2016, 9 pps.: with English Translation.
PCT (CN) Search Report, Application No. PCT/CN2016/077331, dated Jun. 30. 2016, 5 pps.

* cited by examiner

VACUUM DEPOSITION APPARATUS AND VAPOR DEPOSITION METHOD

CROSS REFERENCE TO RELATED APPLICATIONS

This application is a National Stage Entry of PCT/CN2016/077331 filed Mar. 25, 2016, which claims the benefit and priority of Chinese Patent Application No. 201510388186.7, filed Jun. 30, 2015, the disclosures of which are incorporated by reference herein in their entirety as a part of the present application.

BACKGROUND

Embodiments of the present disclosure relate to the display technology, and more particularly to a vacuum deposition apparatus and a vapor deposition method.

At present, the evaporation and deposition process is widely used in the production of electronic devices in a film deposition process, the principle of which is to place the substrate to be deposited in a vacuum, heat the evaporation material to a certain temperature through an evaporation source to be vaporized or sublimated, so that the evaporation material is condensed and deposited on the surface of the substrate to be deposited to complete the film deposition.

The structure of a conventional vapor deposition apparatus may be as shown in FIG. 1. In the vacuum chamber 1 is provided an evaporation source 5, a vapor deposition zone 2 is provided above the evaporation source 5, at the outlet of the evaporation source 5 are provided correspondingly a crystal sensor 4 and a baffle plate 3, and the crystal sensor 4 is used to detect the evaporation rate. The substrate to be vapor-deposited is placed in the vapor deposition zone 2, and the substrate is subjected to film formation after the rate of the evaporation source 5 is stabilized. In order to ensure the stability of the vapor deposition, it is necessary to maintain the evaporation source 5 at a constant evaporation rate and to be constantly in an evaporative state so that the evaporation source 5 remains in the evaporative state in the time between moving out of the substrate that has completed the deposition and moving in of a new substrate, which causes waste of the evaporation material. Further, the evaporation source 5 can only perform film formation in a specific direction and cannot perform film formation in a plurality of directions at the same time, and thus the working efficiency is not high. In addition, during the vapor deposition, once the evaporation source becomes unstable, etc., it is necessary to stop moving in the substrate until the evaporation source returns to normal, resulting in a waste of production time.

BRIEF DESCRIPTION

(A) The Technical Problems to be Solved

The technical problem to be solved by the present disclosure is to provide a vacuum deposition apparatus so that the utilization of the evaporation material and the uniformity of the film formation can be improved and the work efficiency can be improved during the vacuum deposition process.

(B) The Technical Solution

In order to solve the above technical problems, the present disclosure provides a vacuum deposition apparatus, including a vacuum chamber and a rotary base, an evaporation source and a plurality of vapor deposition zones arranged in series from bottom to top in the vacuum chamber, wherein the shape of the rotary base is a Reuleaux triangle, and the trajectories of movement of its vertices in the horizontal plane is a rounded square, the vapor deposition zones are arranged at intervals along the trajectories of movement of the vertices of the rotary base, and the evaporation source is driven by the rotary base to pass below the vapor deposition zones sequentially.

According to an exemplary embodiment of the present disclosure, the vacuum chamber is provided therein with a base guide rail having a rounded square shape and located on an outer side the rotary base, the vertices of the rotary base are slidably connected to the base guide rail respectively.

According to an exemplary embodiment of the present disclosure, an evaporation source guide rail is provided on the rotary base and between the center and an vertex thereof, and the evaporation source is slidable along the direction of the evaporation source guide.

According to an exemplary embodiment of the present disclosure, the evaporation source is of a point source type.

According to an exemplary embodiment of the present disclosure, the evaporation source is of a line source type, a turret is provided below the evaporation source, and the turret is used to drive the evaporation source to be always perpendicular to the base guide rail during the vapor deposition process. According to an exemplary embodiment of the present disclosure, the vacuum deposition apparatus further includes a crystal sensor and a baffle plate, wherein the crystal sensor is disposed obliquely along the opening direction of the evaporation source for detecting the evaporation rate of the evaporation source, and the baffle plate is located between the crystal sensor and the evaporation source.

According to an exemplary embodiment of the present disclosure, the vacuum deposition apparatus further includes a vacuum pump connected to the vacuum chamber through an air suction duct.

According to an exemplary embodiment of the present disclosure, the vacuum deposition apparatus further includes driving device for driving the rotary base to rotate.

According to an exemplary embodiment of the present disclosure, the evaporation source is a plurality of evaporation sources.

In addition, the present disclosure also provides a vapor deposition method of the vacuum deposition apparatus, including the following steps:

S1, loading an evaporation material into at least one evaporation source and causing the evaporation source to be at the center of the rotary base;

S2, moving the evaporation source the evaporation rate of which is first stabilized to a vertex position of the rotary base, and placing a plurality of substrates to be vapor-deposited respectively in the plurality of vapor deposition zones, wherein no substrate is placed in the vapor deposition zone corresponding to and above the first stabilized evaporation source, or no corresponding vapor deposition zone is above the first stabilized evaporation source; and S3, starting the rotary base so that the first stabilized evaporation source passes through each of the vapor deposition zones sequentially to carry out the vapor deposition operation on the plurality of substrates to be vapor-deposited in different directions during the same vapor deposition operation, and then removing the substrate that has completed vapor deposition.

According to an exemplary embodiment of the present disclosure, the vapor deposition method further includes, after the substrate that has completed vapor deposition is removed, a new substrate to be vapor-deposited is placed correspondingly.

According to an exemplary embodiment of the present disclosure, the at least one evaporation source includes a plurality of evaporation sources, and the method further includes:

S4, for each of the other evaporation sources the evaporation rates of which are stabilized successively, moving the evaporation source to the corresponding vertex on the rotary base when the corresponding vertex of the rotary base is located in the gap between two vapor deposition zones, until all the evaporation sources are involved in the vapor deposition operation.

According to an exemplary embodiment of the present disclosure, the vapor deposition method further includes the following step:

S5, if the evaporation rate of one of the evaporation sources is unstable during the vapor deposition process, controlling the evaporation source to be moved to the center of the rotary base to be maintained when the evaporation source is rotated into the gap between the two vapor deposition zones, when the evaporation rate of the evaporation source is stabilized and the vertex of the rotary base corresponding to the evaporation source is located in the gap between two vapor deposition zones, moving the evaporation source to the vertex of the rotary base to perform a vapor deposition operation.

(C) Beneficial Effects

The solutions of the above-described embodiments of the present disclosure have the following advantageous effects: embodiments of the present disclosure provide a vacuum deposition apparatus in which the shape of the rotary base is designed as a Reuleaux triangle, the rotary base can drive the evaporation source to pass below the vapor deposition zones sequentially so that the evaporation source can be used to perform a vapor deposition operation in a plurality of directions during the same vapor deposition operation, thus improving the uniformity of the film formation and the utilization of the evaporation material, and improving the work efficiency.

DETAILED DESCRIPTION

Figure 1:
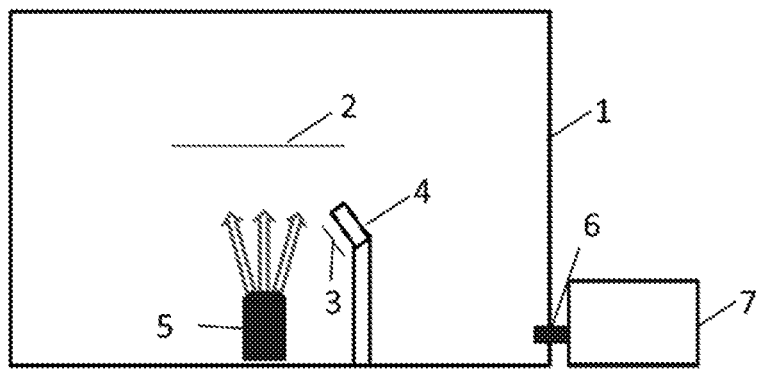
FIG. 1 is a schematic structural diagram of a conventional deposition apparatus.

Embodiments of the present disclosure will now be described in further detail with reference to the accompanying drawings and examples. The following examples are intended to illustrate the disclosure, but are not intended to limit the scope of the disclosure.

In the description of the present disclosure, it is to be noted that the meanings of "a plurality of" are two or more unless otherwise specified. The orientation or positional relationship indicated by the terms "upper", "lower", "left", "right", "outer", "front", "back", "head", "tail", etc. is based on the orientation or positional relationship shown in the drawings, and is used only to describe the present disclosure and to simplify the description, rather than indicating or implying that the device or element referred to must have a specific orientation, is constructed and operated in a specific orientation, and therefore cannot be construed as limiting the disclosure. In addition, the terms "first", "second", "third" and the like are used for descriptive purposes only and are not to be construed as indicating or implying relative importance.

In the description of the present disclosure, it is further to be understood that the terms "install", "connect" and "connection" should be broadly understood, unless otherwise specified and defined. For example, it may be a fixed connection, or a removable connection, or a integral connection, it may be either a mechanical connection or an electrical connection, or it may be either a direct connection or an indirect connection through intermediate media. The specific meaning of the above-mentioned terminology in the present disclosure will be apparent to those skilled in the art in view of the specific circumstances.

Figure 2:
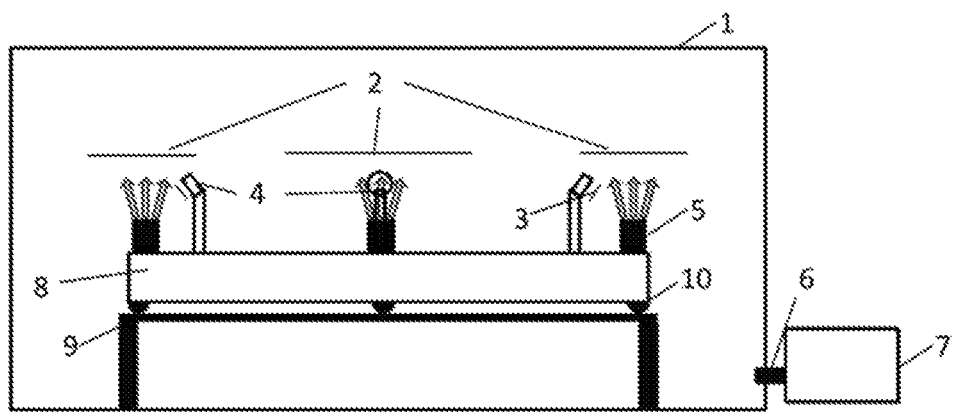
FIG. 2 is a schematic structural diagram of a vacuum deposition apparatus according to an embodiment of the present disclosure.
Figure 6:
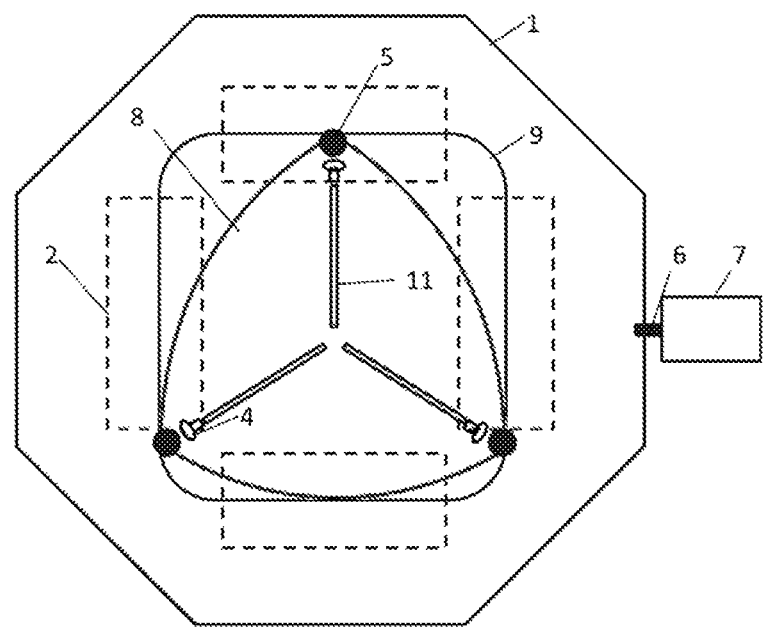
FIG. 6 is a state diagram of the vacuum deposition apparatus according to an embodiment of the present disclosure when step S4 is performed.

As shown in FIG. 2 and FIG. 6, the vacuum deposition apparatus according to the present embodiment includes a vacuum chamber 1, a rotary base 8, an evaporation source 5, and a plurality of vapor deposition zones 2 arranged in series from bottom to top in the vacuum chamber 1, wherein the shape of the rotary base 8 is the Reuleaux triangle. The Reuleaux triangle refers to the shape formed in the following way: taking each vertex of an equilateral triangle as the center, the side length as the radius, and drawing an arc between the other two vertices, the triangle with curved sides formed by the three arcs is a Reuleaux triangle. In rotation of the rotary base 8 of the shape of a Reuleaux triangle, the trajectory of movement of its vertices at the horizontal plane is a rounded square, that is, its trajectory is a square with an arc transition for each corner, so that the evaporation source 5 has a straight line trajectory in a plurality of directions (along the straight sides of the rounded square), which is beneficial to the uniformity of film formation, vapor deposition zones 2 are provided at intervals along the rotational trajectory of the rotary base 8, for accommodating the substrates 12 to be vapor-deposited. At the same time, the evaporation source 5 passes below the vapor deposition zones 2 in turn driven by the rotary base 8 so as to uniformly form films on the substrates 12 to be vapor-deposited in a plurality of directions during the same vapor deposition operation.

In order to increase the stability of the vapor deposition, the rotary base 8 can be rotated by means of a slide rail. Specifically, a base guide rail 9 is provided in the vacuum chamber 1, and the base guide rail 9 has a shape of a rounded square so as to ensure to correspond to the rotational trajectory of the rotary base 8, and the base guide rail 9 is located at outer side of the rotary base 8, and at the same time, the vertices (the intersections of adjacent two curved sides) of the rotary base 8 are slidably connected to the base guide rails 9 respectively, ensuring that the rotary base 8 is rotated at the inner side the base guide rail 9.

Of course, the plurality of vapor deposition zones 2 are also located above the periphery of the base guide rail 9 correspondingly. For example, the number of the vapor deposition zones 2 is four, each of which is rectangular in shape and is located correspondingly above a respective straight side of the base guide rail 9, so that the trajectory of movement of the evaporation source 5 when passing through the vapor deposition zone 2 is a straight line, thus ensuring the uniformity of the film formation.

Correspondingly, according to an exemplary embodiment of the present disclosure, the number of evaporation sources 5 is a plurality, and preferably three, and can be moved along the radial direction (center-to-vertex) of the rotary base 8, respectively. An evaporation source guide rail 11 is provided on the rotary base 8 and between its center and a vertex, and an evaporation source 5 is slidably mounted on the evaporation source guide rail 11 for sliding in the direction of the evaporation source guide rail 11.

Since the vacuum deposition apparatus can perform a vapor deposition operation in a plurality of directions, it is possible to carry out the feeding and extracting operation of a substrate in either one of the directions, while vapor deposition operations can be performed in the other directions. As a result, the vacuum deposition apparatus has the functions of enhancing the evaporation time of an evaporation source 5, and reducing the waste of the evaporation material. Specifically, the rotary base 8 is rotated in the base guide rail 9, and since the base guide rail 9 is a rounded square, the evaporation sources 5 are used to carry out vapor deposition simultaneously in three directions (any three straight sides of the rounded square), and the fourth direction (along the other straight side of the rounded square) is used to perform the feeding and extracting operation of a substrate, thus increasing the vapor deposition time of the evaporation source 5 and reducing the waste of the evaporation material.

In addition, when the evaporation rate of an evaporation source 5 is unstable, it can be retracted to the center position of the rotary base 8, and when its evaporation rate becomes stable, it can be moved to a vertex position of the rotary base 8 to be used for film formation. Thus the utilization and fault tolerance of the whole vacuum evaporation system is enhanced.

Therein, the form of the evaporation source 5 is not limited, and it may be of a point source type (the evaporation outlet is of a circular shape) or a line source type (the evaporation outlet is of a straight line shape). When the evaporation source 5 is of the line source type, a turret is provided below the evaporation source 5 for driving the evaporation source 5 to be always perpendicular to the base guide rail 9 during the vapor deposition process, that is, whenever the evaporation source 5 passes through a vapor deposition zone 2, the evaporation outlet of a straight line shape and the base guide rail 9 are perpendicular to each other, thereby increasing the vapor deposition range and improving the vapor deposition efficiency.

The vacuum deposition apparatus further includes a crystal sensor 4 and a baffle plate 3, the crystal sensor 4 is disposed obliquely along the opening direction of the evaporation source 5 for detecting the evaporation rate of the evaporation source 5, and the baffle plate 3 is located between the crystal sensor 4 and the evaporation source 5 for preventing the evaporation material from the evaporation source 5 from damaging the crystal sensor 4, thereby extending its service life. Of course, the baffle plate 3 is also provided with a baffle opening which allows the evaporation material to pass through when the crystal sensor 4 detects the evaporation rate, thereby improving the measurement accuracy. Further, the crystal sensor 4 can be slidably mounted on the base guide rail 9 by means of a bracket or the like and can be moved together with the evaporation source 5.

The vacuum deposition apparatus further includes a vacuum pump 7, which is connected to the vacuum chamber 1 through an air suction duct 6, for providing a vacuum environment for the vapor deposition process.

The vacuum deposition apparatus further includes a driving device 10 for driving the rotary base 8 to rotate, and the driving device 10 is not limited in its form. For example, a motor drive can be used to increase the degree of automation.

Figure 3:
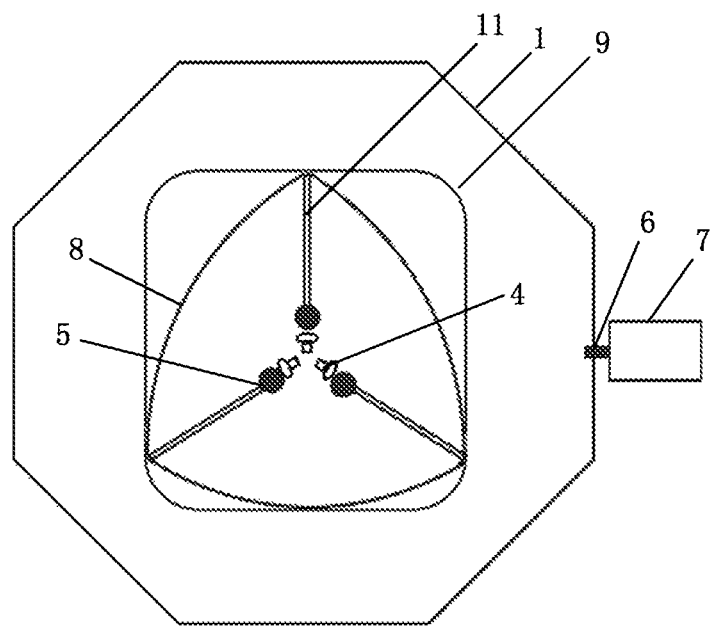
FIG. 3 is a state diagram of the vacuum deposition apparatus according to an embodiment of the present disclosure when step S1 is performed.

In addition, the present disclosure also provides a vapor deposition method using the above-described vacuum deposition apparatus, including the following steps:

S1, loading an evaporation material into at least one evaporation source, the evaporation material may be the same material or may be different materials. In the initial state, the evaporation sources are at the center of the rotary base, with three evaporation sources as an example. As shown in FIG. 3, the first evaporation source, the second evaporation source and the third evaporation source are all retracted to the center position of the rotary base. Of course, there can be only one evaporation source.

S2, moving the evaporation source that has been first stabilized to a vertex position of the rotary base, and placing a plurality of substrates to be vapor-deposited respectively in respective vapor deposition zones, wherein no substrate is placed in the vapor deposition zone corresponding to and above the first stabilized evaporation source, or no corresponding vapor deposition zone is above the first stabilized evaporation source, that is, in the vapor deposition zone right above the first stabilized evaporation source no substrate is placed, while in the remaining vapor deposition zones substrates can be placed. Alternatively, the first stabilized evaporation source may be located between two vapor deposition zones, so that in all the vapor deposition zones substrates can be placed. Further, in each of the remaining vapor deposition zones a substrate to be vapor deposited may be placed when the first stabilized evaporation source is located in the gap between this vapor deposition zone and the previous vapor deposition zone.

Figure 4:
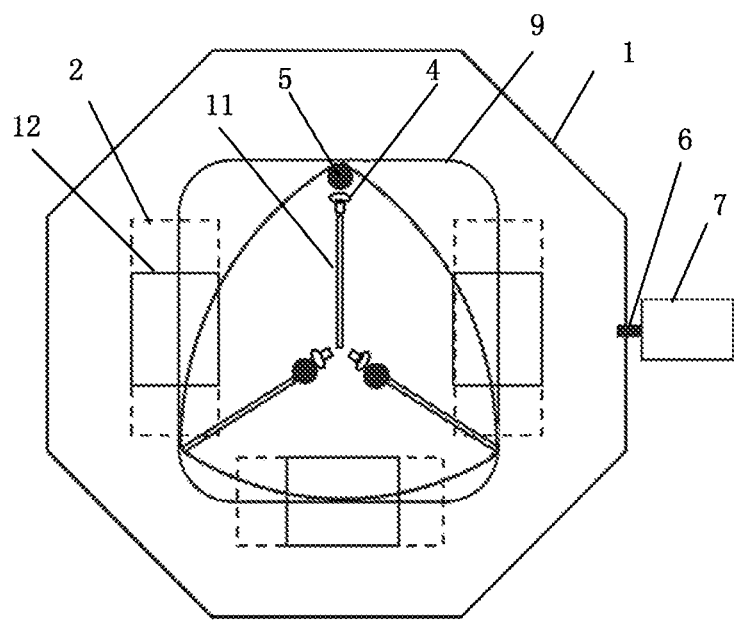
FIG. 4 is a state diagram of the vacuum deposition apparatus according to an embodiment of the present disclosure when step S2 is performed.

As shown in FIG. 4, assuming that a first evaporation source is the evaporation source that has been first stabilized, the first evaporation source is moved to a vertex position of the rotary base, a second evaporation source and a third evaporation source remain stationary, the next vapor deposition zone that the first evaporation source is about to pass is taken as a first feeding and extracting window for feeding a substrate to be vapor deposited, and in each of the remaining vapor deposition zones a substrate can be placed when the evaporation source is located in the gap between this vapor deposition zone and the preceding vapor deposition zone.

S3, starting the rotary base so that the first stabilized evaporation source passes below each vapor deposition zone in turn to carry out the vapor deposition operation on the substrates to be vapor-deposited in different directions during the same vapor deposition operation. After completion of the vapor deposition, the substrates that have completed the vapor deposition are removed from the vapor deposition zones, and then new substrates to be vapor deposited can be placed into to wait for the next vapor deposition operation.

Figure 5:
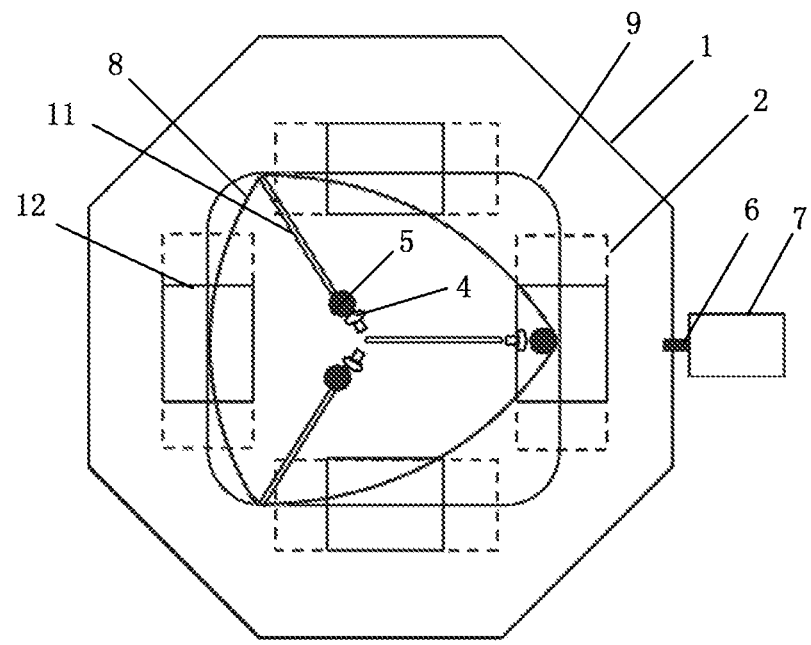
FIG. 5 is a state diagram of the vacuum deposition apparatus according to an embodiment of the present disclosure when step S3 is performed.

As shown in FIG. 5, the rotary base starts to rotate, driving the first evaporation source to pass below the respective vapor deposition zones sequentially to carry out vapor deposition of a plurality of substrates to be vapor-deposited in different directions during the same vapor deposition operation. Of course, after the vapor deposition is completed, the feeding and extracting window of the respective vapor deposition zone allows the substrate that has been vapor-deposited to be taken out.

According to an exemplary embodiment of the present disclosure, the at least one evaporation source includes a plurality of evaporation sources, the vapor deposition method further includes the following step:

S4, for each of the other evaporation sources the evaporation rates of which are stabilized successively, moving the evaporation source to the corresponding vertex on the rotary base when the corresponding vertex of the rotary base is located in the gap between two vapor deposition zones, until all the evaporation sources are involved in the vapor deposition operation.

As shown in FIG. 6, when the evaporation rates of the second evaporation source and the third evaporation source are also successively stabilized, and when the vertices of the rotary base are located in the gaps between two vapor deposition zones, they are moved to the corresponding vertices on the rotary base respectively. Specifically, when the vertex of the rotary base corresponding to the second evaporation source is located in the gap between two vapor deposition zones, it is quickly moved to the corresponding vertex on the rotary base during this time interval; similarly, when the vertex of the rotary base corresponding to the third evaporation source is located in the gap between two vapor deposition zones, it is quickly moved to the corresponding vertex on the rotary base during this gap time, so that a continuous operation can be achieved.

According to an exemplary embodiment of the present disclosure, the vapor deposition method further includes the following step:

S5, if the evaporation rate of one of the evaporation sources is unstable or otherwise faulty during the vapor deposition process, the evaporation source is controlled to be moved to the center of the rotary base to be maintained as it is rotated into the gap between two vapor deposition zones, and the newly processed substrate may be judged to be defective depending on the situation, when the evaporation rate of the evaporation source rate becomes stable and the vertex of the rotary base corresponding to the evaporation source is located in the gap between the two vapor deposition zones, the evaporation source is moved to the vertex of the rotary base to carry out the vapor deposition operation.

In summary, the present disclosure provides a vacuum deposition apparatus, wherein the shape of a rotary base is designed as a Reuleaux triangle, which can drive evaporation sources to pass sequentially below a plurality of vapor deposition zones so that the evaporation sources can be used to perform vapor deposition operations simultaneously in a plurality of directions, thus improving the uniformity of the film formation and the utilization of the evaporation material, and being conducive to the promotion and application.

Embodiments of the disclosure are given by way of example and description, and are not intended to be exhaustive or to limit the disclosure to the form disclosed. Many modifications and variations will be apparent to those of ordinary skill in the art. The embodiments are chosen and described in order to better illustrate the principles and practical application of the disclosure and to enable one of ordinary skill in the art to understand the disclosure and thus to design various embodiments with various modifications which are suitable for a particular application.

What is claimed is:

1. A vacuum deposition apparatus comprising:
a vacuum chamber; and
a rotary base, an evaporation source, and a plurality of substrates to be vapor deposited in the vacuum chamber;
wherein a shape of the rotary base is a Reuleaux triangle,
wherein trajectories of movement of vertices of the rotary base in a first horizontal plane form a rounded square, and the substrates are arranged in series in a second horizontal plane at intervals along the trajectories,
wherein a base guide rail having a rounded square shape is located on an outer side of the rotary base, and the vertices are slidably connected to the base guide rail respectively, and
wherein the evaporation source is moved from a center of the rotary base to a vertex of the vertices and driven by the rotary base to pass below the substrates sequentially.

2. The vacuum deposition apparatus according to claim 1, wherein an evaporation source guide rail extends between the center and a vertex of the rotary base, and the evaporation source is slidable along a direction of the evaporation source guide rail.

3. The vacuum deposition apparatus according to claim 2, wherein the evaporation source is of a point source type.

4. The vacuum deposition apparatus according to claim 2, wherein the evaporation source is of a line source type, wherein a turret is provided below the evaporation source, and wherein the turret is used to drive the evaporation source to be always perpendicular to the base guide rail during a vapor deposition process.

5. The vacuum deposition apparatus according to claim 1, further comprising a crystal sensor and a baffle plate, wherein the crystal sensor is disposed obliquely with respect to an opening direction of the evaporation source to detect the evaporation rate of the evaporation source, and wherein the baffle plate is located between the crystal sensor and the evaporation source.

6. The vacuum deposition apparatus according to claim 1, further comprising a vacuum pump connected to the vacuum chamber through an air suction duct.

7. The vacuum deposition apparatus according to claim 1, further comprising a driving device configured to drive the rotary base to rotate.

8. The vacuum deposition apparatus according to claim 1, wherein the evaporation source comprises a plurality of evaporation sources.

9. A vapor deposition method for a vacuum deposition apparatus according to claim 1, comprising:
loading an evaporation material into the evaporation source and causing the evaporation source to be at the center of the rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

10. The vapor deposition method according to claim 9, further comprising, after removing the substrate that has completed vapor deposition, placing a new substrate to be vapor-deposited.

11. The vapor deposition method according to claim 9, wherein the vacuum deposition apparatus includes at least one additional evaporation source, and wherein the method further comprises:
for the at least one additional evaporation source, an evaporation rate of which is stabilized after the evaporation source, moving the at least one additional evaporation source to a corresponding vertex on the rotary base when the corresponding vertex of the rotary base is located in a gap between two vapor deposition zones, until all the evaporation sources are involved in the deposition operation.

12. The vapor deposition method according to claim 9, further comprising:
if the evaporation rate of the evaporation source is unstable during the vapor deposition operation, controlling the evaporation source to be moved to the center of the rotary base for maintenance when the evaporation source is rotated into a gap between two vapor deposition zones; and
when the evaporation rate of the evaporation source is stabilized and the vertex of the rotary base corresponding to the evaporation source is located in the gap between two vapor deposition zones, moving the evaporation source to the vertex of the rotary base to perform the vapor deposition operation.

13. A vapor deposition method for a vacuum deposition apparatus according to claim 2, comprising:
loading an evaporation material into the evaporation source and causing the evaporation source to be at the center of a rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

14. A vapor deposition method for a vacuum deposition apparatus according to claim 3, comprising:
loading an evaporation material into the evaporation source and causing the evaporation source to be at the center of a rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

15. A vapor deposition method for a vacuum deposition apparatus according to claim 4, comprising:
loading an evaporation material into the evaporation source and causing the evaporation source to be at the center of a rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

16. A vapor deposition method for a vacuum deposition apparatus according to claim 5, comprising:
loading an evaporation material into the evaporation source and causing the evaporation source to be at the center of a rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

17. A vapor deposition method for a vacuum deposition apparatus according to claim 6, comprising:
loading an evaporation material into the evaporation source and causing the evaporation source to be at the center of a rotary base;
moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and
starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

18. A vapor deposition method for a vacuum deposition apparatus according to claim 7, comprising:

loading an evaporation material into the evaporation source and causing the evaporation source to be at the center of a rotary base;

moving the evaporation source, an evaporation rate of which is stabilized, to a vertex position of the rotary base, and placing the plurality of substrates to be vapor deposited respectively in a plurality of vapor deposition zones, wherein i) no substrate is placed in one of the vapor deposition zones corresponding to and above the evaporation source, or ii) no corresponding vapor deposition zone is above the evaporation source; and starting the rotary base so that the evaporation source passes through each of the vapor deposition zones sequentially to carry out a vapor deposition operation on the plurality of substrates to be vapor-deposited in different directions during the same vapor deposition operation, and then removing a substrate that has completed vapor deposition.

\* \* \* \* \*

UNITED STATES PATENT AND TRADEMARK OFFICE
CERTIFICATE OF CORRECTION

PATENT NO. : 10,081,860 B2
APPLICATION NO. : 15/511577
DATED : September 25, 2018
INVENTOR(S) : Gu Yao et al.

Page 1 of 1

It is certified that error appears in the above-identified patent and that said Letters Patent is hereby corrected as shown below:

In the Claims

In Claim 1, Column 8, Line 17, delete "vertices and driven" and insert therefor -- vertices and is driven --.
In Claim 2, Column 8, Line 21, delete "guide rail extends" and insert therefor -- guide rail is provided on the rotary base and extends --.
In Claim 2, Column 8, Line 22, delete "base, and the" and insert therefor -- base, and wherein the --.

Signed and Sealed this
Twenty-sixth Day of February, 2019

Andrei Iancu
*Director of the United States Patent and Trademark Office*